United States Patent
Coddington et al.

(10) Patent No.: US 6,326,811 B1
(45) Date of Patent: Dec. 4, 2001

(54) OUTPUT BUFFER AND METHOD THEREFOR

(75) Inventors: John Deane Coddington, Cedar Park; Perry H. Pelley III, Austin, both of TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/659,400

(22) Filed: Sep. 11, 2000

Related U.S. Application Data

(63) Continuation of application No. 09/131,515, filed on Aug. 10, 1998.

(51) Int. Cl.[7] ............................................. H03K 19/003
(52) U.S. Cl. .................................. 326/83; 376/87; 376/68
(58) Field of Search .................................. 326/56, 57, 58, 326/68, 80, 81, 82, 83, 86

(56) References Cited

U.S. PATENT DOCUMENTS

| | | | |
|---|---|---|---|
| 4,504,747 | 3/1985 | Smith et al. | 307/475 |
| 5,381,062 * | 1/1995 | Morris | 326/68 |
| 5,764,077 | 6/1998 | Andresen et al. | 326/34 |
| 5,917,361 | 6/1999 | Wong et al. | 327/391 |
| 5,933,025 | 8/1999 | Nance et al. | 326/81 |
| 6,028,450 * | 2/2000 | Nance | 326/81 |
| 6,078,197 * | 6/2000 | Kawano | 327/108 |

* cited by examiner

Primary Examiner—Michael Tokar
Assistant Examiner—Ahn Tran
(74) Attorney, Agent, or Firm—Joanna G. Chiu

(57) ABSTRACT

An output buffer (200) having a protection circuit (228, 230, 232) which adjusts control of an output drive circuit (224, 226) in response to external voltages on the output pin (202). When the output pin is in a tri-state condition and receives an external voltage which is outside a predetermined voltage range, the protection circuit adjusts the voltage on the control gate of a transistor (224) in the output drive circuit. The protection circuit maintains the voltage across the transistor within the tolerance of the transistor. In one embodiment, the output drive circuit has pullup (204) and pulldown (206) portions. The output buffer provides a high voltage output driver having low voltage devices.

16 Claims, 1 Drawing Sheet

200

US 6,326,811 B1

OUTPUT BUFFER AND METHOD THEREFOR

This application is a Continuation of Ser. No. 09/131,515 filed Aug. 10, 1998.

FIELD OF THE INVENTION

The present invention relates generally to output buffers, and specifically to protection of output buffers having low voltage devices.

BACKGROUND OF THE INVENTION

FIG. 1 depicts, in circuit diagram form, a portion of an output buffer 100 known in the prior art. An output pin 102 is connected to a first current electrode of an n-type or n-channel transistor 104. A control electrode of transistor 104 is coupled to a first voltage supply, labeled OVDD. A second current electrode of transistor 104 is coupled to a first current electrode of an n-type transistor 106. A control electrode of transistor 106 receives an input signal, labeled DATA. A second current electrode of transistor 104 is coupled to a second voltage supply, labeled GND.

In normal operation, if the signal DATA is asserted, then output buffer 100 pulls the voltage on output pin 102 to the second voltage level (a low voltage level). If the signal DATA is not asserted, then output buffer 100 is placed into a high impedance or tri-state and has no effect on output pin 102. Another portion of output buffer 100 (not shown) pulls output pin 102 to the first voltage level (a high logic level) or places the second portion into a high impedance state, depending upon the signal DATA.

When output buffer 100 is off or in a high impedance state, transistor 106 is in a non-conducting state. In this case, external devices connected to output buffer 100 may couple a voltage level to output pin 102 that is either (1) greater than OVDD or (2) less than GND. Transistor 104 protects the gate-to-source voltage across transistor 106 in the case an external voltage is applied to output pin 102 that is greater than OVDD. In this case, transistor 104 clamps the voltage present on the first current electrode of transistor 106 to (OVDD−Vt), where Vt is a threshold voltage drop for an n-type transistor. Therefore, the maximum gate-to-source voltage across transistor 106 in the tri-state is (OVDD−Vt−GND) or simply (OVDD−Vt).

When output buffer 100 is active, transistor 106 may be in a non-conducting state (high logic output) or in a conducting state (low logic output). In these two cases, the maximum gate-to-source voltage across transistor 106 is (DATA−GND) or (OVDD−Vt−GND), respectively.

In certain cases, transistor 104 may itself fail. For instance, if an external device couples a voltage level to output pin 102 that is less than GND, then the gate-to-source voltage across transistor 104 will be (OVDD−GND+Vdiode), where Vdiode is the voltage drop across the parasitic diode in transistor 104. This gate-to-source voltage may exceed the maximum permissible voltage, "$V_{GSMAX}$," allowed by the process technology in which output buffer 100 is fabricated.

Improvements in semiconductor process technology are constantly reducing the difference between OVDD and GND. Unfortunately, Vdiode is a characteristic of the technology that is not changing. Consequently, the gate-to-source voltage across transistor 104, (OVDD−GND+Vdiode), is being more and more influenced by Vdiode and less and less influenced by (OVDD−GND) as transistor geometries shrink.

It would be desirable to limit the gate-to-source voltage across transistor 104, (OVDD−GND+Vdiode) to a level permitted by the process technology in which output buffer 100 is fabricated. Furthermore, it would be desirable to limit the gate-to-source voltage across transistor 104 in a manner which tracks future process developments.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

DESCRIPTION OF A PREFERRED EMBODIMENT

Figure 1:
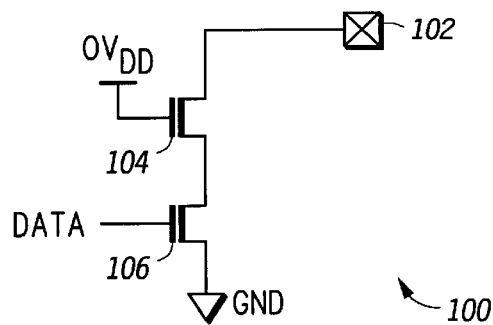
FIG. 1 depicts, in circuit diagram form, a portion of an output buffer known in the prior art.
Figure 2:
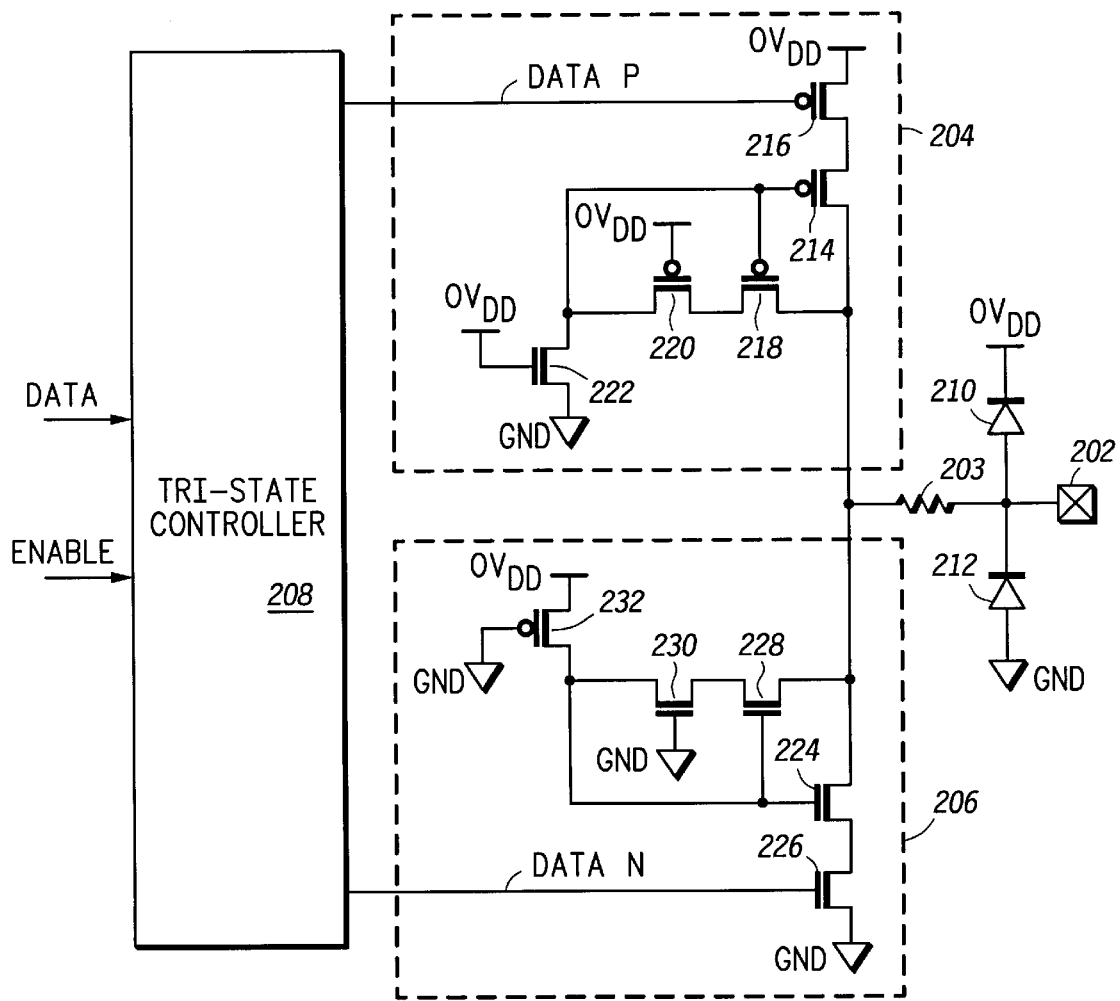
FIG. 2 depicts, in partial circuit diagram form and partial block diagram form, an output buffer according to one embodiment of the present invention.

FIG. 2 depicts, in partial circuit diagram form and partial block diagram form, an output buffer 200 according to one embodiment of the present invention. Output buffer 200 contains circuitry which prevents the various source-to-gate voltages from exceeding $V_{GSMAX}$. The operation of output buffer 200 is generally understood. Conversely, output buffer 200 does not require complex fabrication steps, such as adding a second oxide thickness to the process flow for output buffers. The particular circuitry described is also useful as the voltage difference, (OVDD−GND) shrinks while Vdiode does not.

Continuing with FIG. 2, an output pin 202 is connected to a first terminal of a resistor 203. A second terminal of resistor 203 is connected to an output of a pullup network 204 and to an output of a pulldown network 206. An input of pullup network 204, "DATA P," and an input of pulldown network 206, "DATA N," are generated by a tri-state controller 208. Tri-state controller receives as inputs a signal "DATA" and a signal "ENABLE." A first terminal of each of a diode 210 and a diode 212 are also connected to output pin 202. A second terminal of diode 210 is connected to the first voltage level, OVDD. A second terminal of diode 212 is connected to the second voltage level, GND. Diode 210 is connected between output pin 202 and OVDD such that output pin 202 is clamped to the voltage level (OVDD+Vdiode). Similarly, diode 212 is connected between output pin 202 and GND such that output pin 202 is clamped to the voltage level (GND−Vdiode).

Within pullup network 204, resistor 203 is connected to a first current electrode of a p-type or p-channel transistor 214. A second current electrode of transistor 214 is connected to a first current electrode of a p-type transistor 216. A second current electrode of transistor 216 receives the first voltage level, OVDD. A control electrode of transistor 216 receives the output of tri-state controller, DATA P. A control electrode and the first current electrode of transistor 214 are connected to a control electrode and to a first current electrode of a p-type transistor 218, respectively. A second current electrode of transistor 218 is connected to a first current electrode of a p-type transistor 220. A control electrode of transistor 220 receives the first voltage level, OVDD. A second current electrode of transistor 220 is connected to the control electrode of transistor 214 and to a first current electrode of an ntype transistor 222. A control electrode of transistor 222 receives the voltage level OVDD. A second current electrode of transistor 222 receives the voltage level GND.

Within pulldown network 206, resistor 203 is connected to a first current electrode of a n-type transistor 224. A second current electrode of transistor 224 is connected to a first current electrode of a n-type transistor 226. A second current electrode of transistor 226 receives the first voltage level, GND. A control electrode of transistor 226 receives the output of tri-state controller, DATA N. A control electrode and the first current electrode of transistor 224 are connected to a control electrode and to a first current electrode of a n-type transistor 228, respectively. A second current electrode of transistor 228 is connected to a first current electrode of a n-type transistor 230. A control electrode of transistor 230 receives the first voltage level, GND. A second current electrode of transistor 230 is connected to the control electrode of transistor 224 and to a first current electrode of an p-type transistor 232. A control electrode of transistor 232 receives the voltage level GND. A second current electrode of transistor 232 receives the voltage level OVDD.

In operation, output buffer 200 generates one of (1) a high voltage level, (2) a low voltage level, or (3) a high impedance state at output pin 202. When output buffer 200 is in a high impedance state, transistors 214 and 224 protect transistors 216 and 226, respectively from exceeding their VGSMAx limit. Further, transistors 218 and 220 protect transistor 214 from exceeding its $V_{GSMAX}$ limit. Similarly, transistors 228 and 230 protect transistor 224 from exceeding its $V_{GSMAX}$ limit.

(1) A High Voltage Level At Output Pin 202

When DATA and ENABLE are both asserted, tri-state controller 208 asserts DATA P (active low) and de-asserts DATA N (active high). When asserted, DATA P places transistor 216 into a conducting state. Transistor 222 is always in a conducting state. Transistor 222 pulls the control electrode of transistor 214 to the second voltage level, GND, placing transistor 214 into a conducting state. These two transistors couple the first voltage level, OVDD to the output pin 202. Normally, transistors 218 and 220 have no effect.

When de-asserted, DATA N places transistor 226 into a non-conducting state. Transistor 232 is always in a conducting state. Transistor 232 pulls the control electrode of transistor 224 to the first voltage level OVDD, placing transistor 224 into a conducting state. Transistor 224 limits the voltage present on the first current electrode of transistor 226 to (OVDD−Vt). Consequently, the gate-to-source voltage on transistor 226 is (OVDD−Vt−GND) or simply (OVDD−Vt). Normally, transistors 228 and 230 have no effect.

(2) A Low Voltage Level At Output Pin 202

When DATA is de-asserted and ENABLE is asserted, tri-state controller 208 de-asserts DATA P and asserts DATA N. When asserted, DATA N places transistor 226 into a conducting state. As described above, transistors 224 and 232 are always in a conducting state. Transistor 224 and 226 couple the second voltage level, GND to the output pin 202. Normally, transistors 228 and 230 have no effect.

When de-asserted, DATA P places transistor 216 into a non-conducting state. As described above, transistors 214 and 222 are always in a conducting state. Transistor 214 limits the voltage present on the first current electrode of transistor 216 to (GND+Vt). Consequently, the gate-to-source voltage on transistor 216 is (OVDD−Vt−GND) or simply (OVDD−Vt). Normally, transistors 218 and 220 have no effect.

(3) A High Impedance State At Output Pin 202

When ENABLE is de-asserted, tri-state controller 208 deasserts both DATA P and DATA N. As described above, transistors 214, 222, 224, and 232 are always in a conducting state. However, transistors 216 and 226 are both in a non-conducting state. Therefore, neither voltage level is coupled to output pin 202.

Diodes 210 and 212 and resistor 203 prevent an external device from ever coupling a voltage level (1) more than (OVDD+Vdiode), or (2) less than (GND−Vdiode) to output pin 202. However, in modern semiconductor processes, voltage levels within these limits may still damage transistors 214 or 224.

In the case of a voltage level between (OVDD−Vt) and (OVDD+Vdiode), transistor 224 protects transistor 226 as described above in connection when output buffer 200 drives high. Similarly, transistor 228 protects transistor 230. However, transistor 214 and 218 may be damaged in the region between (OVDD+Vt) and (OVDD+Vdiode). In this region, transistor 220 conducts current. Transistors 218, 220, and 222 thereby form a voltage divider network between output pin 202 and the second voltage level, GND. This divider raises the voltage level on the first current electrode of transistor 222 and, therefore, the voltage levels on the control electrodes of transistors 214 and 218. This attenuated control voltage limits the corresponding gate-to-source voltages of transistors 214 and 218.

Similarly, in the case of a voltage level between (GND+Vt) and (GND−Vdiode), transistor 214 protects transistor 216 as described above in connection when output buffer 200 drives low. Similarly, transistor 218 protects transistor 220. However, transistor 224 and 228 may be damaged in the region between (GND−Vt) and (GND−Vdiode). In this region, transistor 230 conducts current. Transistors 228, 230, and 232 thereby form a voltage divider network between output pin 202 and the first voltage level, OVDD. This divider lowers the voltage level on the first current electrode of transistor 232 and, therefore, the voltage levels on the control electrodes of transistors 224 and 228. This attenuated control voltage limits the corresponding gate-to-source voltages of transistors 224 and 228.

In the depicted embodiment, specific voltage levels are coupled to transistors 222 and 232. In other embodiments, other voltages may be connected to these devices. For instance, an internal power supply voltage level (VDD) can be connected to the control electrode of transistor 222 and/or to the second current electrode of transistor 232. In still another embodiment of the invention, the control electrodes of transistors 222 and 232 can be coupled to a wide range of supplied or generated voltage levels. The voltage level coupled to the control electrode of 222 need only be greater than GND by Vt. Similarly, the voltage level coupled to the control electrode of 232 need only be lower than OVDD by Vt.

Those skilled in the art will recognize that modifications and variations can be made without departing from the spirit of the invention. Therefore, it is intended that this invention encompass all such variations and modifications as fall within the scope of the appended claims.

What is claimed is:

1. An output buffer, comprising:
    an output pin;
    a drive circuit coupled to the output pin, the drive circuit adapted to drive an output voltage on the output pin, the drive circuit comprising:
        a first transistor having a first node coupled to the output pin and a control gate adapted to receive the control voltage from the drive protection circuit; and
    a drive protection circuit adapted to provide a control voltage to the drive circuit, wherein the drive protection circuit comprises:

a second transistor having a first node coupled to the control gate of the first transistor and adapted to provide the control voltage to the drive circuit; and a third transistor having a first node coupled to the output pin, a second node coupled to the first node of the second transistor, and a control gate coupled to the control gate of the first transistor;

wherein when the drive circuit is disabled from driving the output voltage on the output pin and the output pin receives an external voltage which is outside of a predetermined voltage range, the drive protection circuit adjusts the control voltage.

2. The output buffer of claim 1, wherein the drive circuit comprises:

a voltage divider circuit between the output pin and an internal reference voltage.

3. The output buffer of claim 2, wherein the voltage divider circuit comprises the second transistor and the third transistor.

4. The output buffer of claim 1, wherein the drive protection circuit comprises:

a fourth transistor having a first node coupled to the first transistor and a second node coupled to a reference voltage;

wherein the first transistor protects the fourth transistor from voltage spikes in the external voltage.

5. The output buffer of claim 4, wherein either:

the first transistor and the third transistor are n-channel devices and the second transistor is a p-channel device, or the first transistor and the third transistor are p-channel devices and the second transistor is an n-channel device.

6. The output buffer of claim 4, wherein the drive protection circuit further comprises:

a fifth transistor coupled to the third transistor, wherein the fifth transistor protects the third transistor from voltage spikes in the external voltage.

7. The output buffer of claim 6, wherein adjustment of the control voltage is a function of a parametric relation between the second, third, and fifth transistors.

8. The output buffer of claim 7, wherein the parametric relation is based on at least one of transistor width and transistor length.

9. The output buffer of claim 1, wherein the drive protection circuit reduces the control voltage when the external voltage falls.

10. The output buffer of claim 1, wherein the drive protection circuit increases the control voltage when the external voltage rises.

11. The output buffer of claim 1, further comprising:

an electrostatic discharge (ESD) protection circuit coupled between the output pin and the drive circuit, the ESD protection circuit comprising:

at least one switch coupled to the output pin; and a resistive element coupled between the at least one diode and the drive circuit.

12. The output buffer of claim 1, wherein the predetermined voltage range is a function of a voltage parameter of the first transistor.

13. The output buffer of claim 1, further comprising:

a second drive circuit adapted to provide the output voltage on the output pin; and a second drive protection circuit adapted to provide a second control voltage to the second drive circuit;

wherein when the second drive circuit is disabled from driving the output voltage on the output pin and the output pin receives an external voltage which is outside of the predetermined range, the second drive protection circuit adjusts the second control voltage.

14. The output buffer of claim 13, further comprising:

a ti-state controller adapted to enable either the drive circuit or the second drive circuit.

15. A method for protecting an output pin of an integrated circuit, the method comprising the steps of:

disabling a drive circuit coupled to the output pin;

providing a control voltage to the drive circuit;

receiving a voltage on the output pin from external to the integrated circuit;

voltage dividing the voltage on the output pin with respect to an internal reference voltage; and adjusting the control voltage to the drive circuit when the voltage is outside of a predetermined voltage range, wherein adjusting comprises reducing the control voltage when the voltage falls below a predetermined low threshold voltage.

16. The method of claim 15, wherein the step of adjusting comprises the step of:

increasing the control voltage when the voltage rises above a predetermined high threshold voltage.

* * * * *